(12) United States Patent
Kwon et al.

(10) Patent No.: US 7,880,503 B2
(45) Date of Patent: Feb. 1, 2011

(54) METHOD OF DRIVING GATE LINES, GATE LINE DRIVE CIRCUIT FOR PERFORMING THE METHOD AND DISPLAY DEVICE HAVING THE GATE LINE DRIVE CIRCUIT

(75) Inventors: Yeong-Keun Kwon, Suwon-si (KR);
 Sang-Jin Jeon, Suwon-si (KR);
 Yoon-Jang Kim, Suwon-si (KR);
 Bae-Heuk Yim, Asan-si (KR);
 Bon-Yong Koo, Asan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 12/503,145

(22) Filed: Jul. 15, 2009

(65) Prior Publication Data

US 2010/0207667 A1 Aug. 19, 2010

(51) Int. Cl.
 *H03K 19/094* (2006.01)
 *H03K 19/0175* (2006.01)
(52) U.S. Cl. .............................. 326/83; 326/82; 326/88; 345/99; 345/100

(58) Field of Classification Search ....................... None
 See application file for complete search history.

(56) References Cited

U.S. PATENT DOCUMENTS

2007/0171115 A1* 7/2007 Kim et al. .................... 341/155
2008/0048712 A1* 2/2008 Ahn et al. ...................... 326/21

* cited by examiner

*Primary Examiner*—Anh Q Tran
(74) *Attorney, Agent, or Firm*—F. Chau & Associates, LLC

(57) ABSTRACT

A method of driving gate lines is used to activate the gate lines by outputting output signals of stages to the gate lines. A first node is boosted up based upon a carry signal or the vertical start signal from a previous stage. A gate signal that is pulled up is outputted through an output terminal of a present stage based upon a first clock signal which is boosted up. An off-voltage is outputted through the output terminal of the present stage in response to an output signal from a next stage or the vertical start signal. The first node is discharged in response to the output signal from the next stage or a carry signal from a last stage. A positive ripple voltage at the first node is removed by providing a negative ripple voltage to the first node.

26 Claims, 8 Drawing Sheets

METHOD OF DRIVING GATE LINES, GATE LINE DRIVE CIRCUIT FOR PERFORMING THE METHOD AND DISPLAY DEVICE HAVING THE GATE LINE DRIVE CIRCUIT

CROSS-REFERENCE TO RELATED APPLICATION

This application claims priority to and the benefit of Korean Patent Application No. 2009-12800, filed on Feb. 17, 2009 in the Korean Intellectual Property Office (KIPO), the entire contents of which are incorporated by reference herein.

BACKGROUND OF THE INVENTION

1. Field of the Invention

The present disclosure relates to display devices, and, more particularly, to a method of driving gate lines, a gate line drive circuit for performing the method, and a display device having the gate line drive circuit.

2. Discussion of the Related Art

Recently, to reduce manufacturing costs and the total size of a panel module for a display device, an amorphous silicon gate (ASG) technology has been applied that includes simultaneously forming a gate drive circuit in a peripheral area of a panel and a switching device in a display area of the panel.

Since the ASG technology includes selectively outputting a clock signal in which the phase is continuously changing to generate a gate signal including a gate-on voltage and a gate-off voltage, a noise signal can be generated by the clock signal even when not generating the gate-on voltage. Accordingly, to minimize the noise signal generated when not generating the gate-on voltage, various structures have been proposed.

However, the ASG structures proposed thus far have not effectively controlled the noise signal generated when the temperature of a gate drive part becomes high due to being driven for a long time. Since the noise of the gate signal can reduce display quality as a result, an improved gate driving method is desired.

SUMMARY OF THE INVENTION

In accordance with an exemplary embodiment of the present invention a method of driving gate lines for improving driving reliability and enhancing display quality is provided.

Exemplary embodiments of the present invention also provide a gate drive circuit and a display device having the gate line drive circuit.

According to an exemplary embodiment of the present invention, the method is used for activating the gate lines by outputting output signals of a plurality of stages to the respective gate lines. In this case, each of the output signals includes a gate-on voltage and a gate-off voltage. Additionally, the stages are connected to each other. The stages have a first stage in which a vertical start signal is transmitted to an input terminal. A first node is boosted up based upon a carry signal or the vertical start signal from an external device. Then, the gate-on voltage that is pulled up is outputted through an output terminal of a present stage based upon a high level of a first clock signal when the first node is boosted up to a high level. Then, the gate-off voltage is outputted through the output terminal of the present stage in response to the output signal from a next stage or the vertical start signal. Then, the first node is discharged in response to the output signal from the next stage or a carry signal from a last stage. Then, a positive ripple voltage at the first node which is discharged is removed according to the first clock signal by providing a negative ripple voltage to the first node.

In an exemplary embodiment of the present invention, the negative ripple voltage may be generated by a ripple-removing capacitor, and one end of the ripple-removing capacitor may be connected to the output terminal.

In an exemplary embodiment of the present invention, removing the positive ripple voltage may include charging a second clock signal when the second clock signal is in a high level, and providing the negative ripple voltage to the first node by discharging the second clock signal when the second clock signal is in a low level. In this case, a period of the high level included in the second clock signal may not overlap a period of the high level included in the first clock signal.

In an exemplary embodiment of the present invention, the method of driving gate lines may further include maintaining the voltage of the first node at a low level in response to the first clock signal after the first node is discharged, providing a signal substantially the same as the first clock signal to a second node during a period in which the voltage of the first node is maintained at the low level, and maintaining the gate-off voltage of the output terminal when a signal of the second node or a second clock signal is in a high level.

According to an exemplary embodiment of the present invention, a gate line drive circuit includes a plurality of stages which are connected to each other, the gate line drive circuit outputting output signals of respective stages to gate lines to activate the gate lines. Each of the output signals includes a gate-on voltage and a gate-off voltage. Each of the stages includes a charging part, a pull-up part, a pull-down part, a discharging part and a ripple-removing part. The charging part boosts up a first node based upon a carry signal from a previous stage or a vertical start signal from an external device. The pull-up part outputs the gate-on voltage pulled up through an output terminal of a present stage in response to a high level of a first clock signal when the first node is boosted up to a high level. The pull-down part outputs the gate-off voltage through the output terminal in response to the output signal from a next stage or the vertical start signal. The discharging part discharges the first node in response to the output signal from the next stage or a carry signal from a last stage. The ripple-removing part removes a positive ripple voltage at the first node which is discharged according to the first clock signal by providing a negative ripple voltage to the first node.

In an exemplary embodiment of the present invention, the carry signal of the previous stage may be the output signal of the previous stage.

In an exemplary embodiment of the present invention, the negative ripple voltage may be generated by a ripple-removing capacitor, one end of the ripple-removing capacitor may be connected to the output terminal.

In an exemplary embodiment of the present invention, the ripple-removing part may include a ripple-removing capacitor. The ripple-removing capacitor charges a second clock signal when the second clock signal is in a high level and discharges the second clock signal when the second clock signal is in a low level. A period of the high level included in the second clock signal may not overlap a period of the high level included in the first clock signal. The ripple-removing capacitor may have a capacitance of about 0.1 pF to about 2.0 pF.

In an exemplary embodiment of the present invention, the gate line drive circuit may further include a first holding part, a switching part and a second holding part. The first holding part maintains the voltage of the first node at a low level in response to the first clock signal after the first node is discharged. The switching part provides a signal substantially the same as the first clock signal to a second node during a period in which the voltage of the first node is maintained at the low level. The second holding part maintains a signal from the output terminal at a low level when the gate-off voltage of the second node or a second clock signal is in a high level.

According to an exemplary embodiment of the present invention, a display device includes a display panel, a data line drive part and a gate line drive circuit. The display panel includes a display area in which gate lines and data lines crossing each other are formed, and a peripheral area surrounding the display area. The data line drive part outputs data signals to the data lines. The gate line drive circuit activates the gate lines by outputting output signals of a plurality of stages to the respective gate lines. The stages are connected to each other. Each of the output signals includes a gate-on voltage and a gate-off voltage. Each of stages includes a charging part, a pull-up part, a pull-down part, a discharging part and a ripple-removing part. The charging part boosts up a first node based upon a carry signal from an external device. The pull-up part outputs the gate-on voltage pulled up through an output terminal of a present stage in response to a high level of a first clock signal when the first node is boosted up to a high level. The pull-down part outputs the gate-off voltage through the output terminal in response to an output signal from a next stage or the vertical start signal. The discharging part discharges the first node in response to the output signal from the next stage or a carry signal from a last stage. The ripple-removing part removes a positive ripple voltage at the first node which is discharged according to the first clock signal by providing a negative ripple voltage to the first node.

In an exemplary embodiment of the present invention, the ripple-removing part may include a ripple-removing capacitor. The ripple-removing capacitor charges a second clock signal when the second clock signal is in a high level, and discharges the second clock signal when the second clock signal is in a low level. Here, a period of the high level included in the second clock signal may not overlap a period of the high level included in the first clock signal.

In an exemplary embodiment of the present invention, one end of the ripple-removing capacitor may be connected to the output terminal.

In an exemplary embodiment of the present invention, the gate line drive circuit may be mounted on a first portion of the peripheral area.

In an exemplary embodiment of the present invention, the gate line drive circuit may further include a first holding part, a switching part and a second holding part. The first holding part maintains the voltage of the first node at a low level in response to the first clock signal after the first node is discharged. The switching part provides a signal substantially the same as the first clock signal to a second node during a period in which the voltage of the first node is maintained at the low level. The second holding part maintains the gate-off voltage of the output terminal at a off-voltage level when a signal of the second node or a second clock signal is in a high level.

In an exemplary embodiment of the present invention, the first holding part may include a first holding transistor that electrically connects the first node and the output teniinal to each other in response to the first clock signal. The second holding part may include a second holding transistor that maintains the gate-off voltage of the output terminal at the off-voltage level in response to the second clock signal.

In an exemplary embodiment of the present invention, the first holding transistor may include a first source electrode, a first drain electrode and a first gate electrode. The first source electrode may be electrically connected to the output terminal. The first drain electrode may be electrically connected to the first node. The first gate electrode may receive the first clock signal.

In an exemplary embodiment of the present invention, the second holding transistor may include a second source electrode, a second drain electrode and a second gate electrode. The second source electrode may receive second source electrode. The second drain electrode may be electrically connected to the first source electrode. The second gate electrode may receive the second clock signal. The second drain electrode and the second gate electrode may be extended to overlap each other such that the ripple-removing capacitor is formed.

According to exemplary embodiments of the present invention, in a method of driving gate lines, in a gate line drive circuit for performing the method and in a display device having the gate line drive circuit, a negative ripple voltage applied to a first node according to a first clock signal is generated by a ripple-removing part such that a positive ripple voltage caused by a current flowing between a drain and a gate of a pull-up part can be reduced by the negative ripple voltage.

BRIEF DESCRIPTION OF THE DRAWINGS

The above exemplary embodiments will now be described in detail with reference to the accompanying drawings, in which.

DETAILED DESCRIPTION OF THE EXEMPLARY EMBODIMENTS

Figure 1:
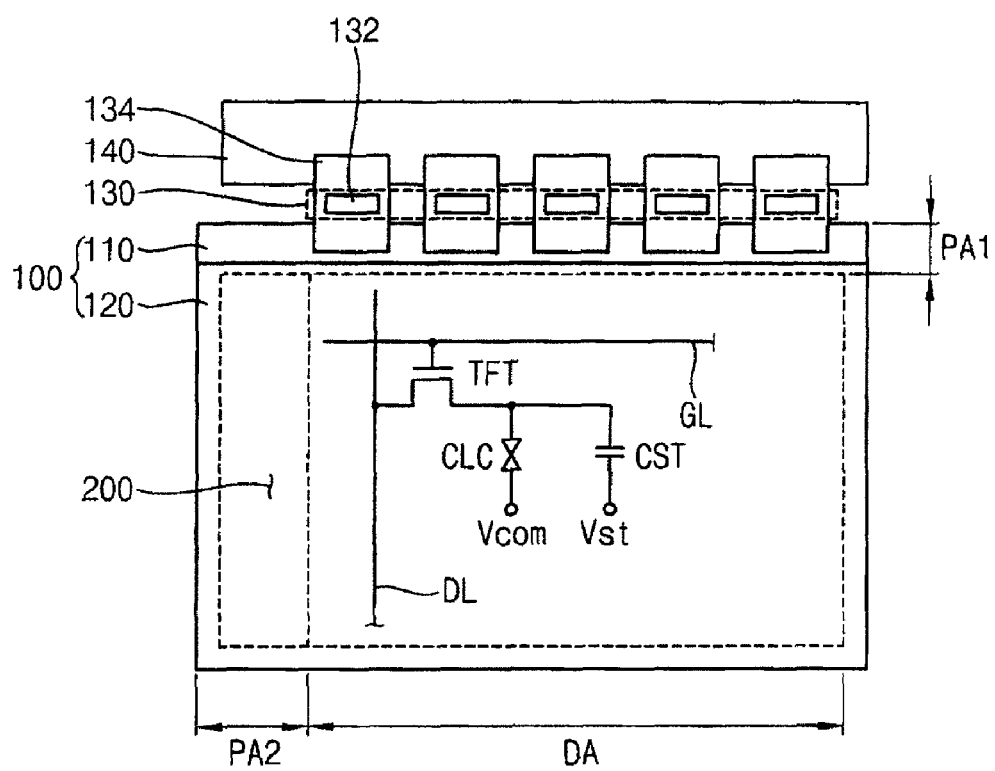
FIG. 1 is a plan view illustrating a display device according to an exemplary embodiment of the present invention.

The present invention is described more fully hereinafter with reference to the accompanying drawings, in which exemplary embodiments of the present invention are shown. The present invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present.

FIG. 1 is a plan view illustrating a display device according to an exemplary embodiment of the present invention. The display device includes a display panel 100, a gate line drive circuit 200 for driving the display panel 100, and a data line drive part 130 for driving the display panel 100.

The display panel 100 includes an array substrate 110, an opposite substrate 120 facing the array substrate 110 (i.e., a color filter substrate), and a liquid crystal layer (not shown) interposed between the array substrate 110 and the opposite substrate 120. The display panel 100 includes a display area DA, a first peripheral area PA1 and a second peripheral area PA2. The first and second peripheral area PA1, PA2 surround the display area DA.

The display area DA includes gate lines GL and data lines DL. A plurality of pixels are defined by the gate lines GL and the data lines DL, such that an image is displayed on the display area DA. Each of the pixels includes A switching element SW, such as a thin-film transistor (TFT), a liquid crystal capacitor CLC and a storage capacitor CST that are electrically connected to the switching element SW.

A gate electrode of the switching element SW is electrically connected to the gate line GL. A source electrode of the switching element SW is electrically connected to the data line DL. A drain electrode of the switching element SW is electrically connected to the liquid crystal capacitor CLC and the storage capacitor CST.

The first peripheral area PA1 is positioned close to a first end portion of the data line DL, and the second peripheral area PA2 is positioned at a first end portion of the gate lines GL.

The gate line drive circuit 200 includes a shift register having a plurality of stages that are connected one after another to each other. The gate line drive circuit 200 sequentially outputs gate signals to the gate lines GL. The gate line drive circuit 200 is integrated on the second peripheral area PA2 of the display panel 100. In an exemplary embodiment, the shift register includes at least first and second groups, each group has a plurality of stages that are connected one after another to each other. The plurality of stages of the first group generate the gate signals to transmit odd-numbered gate lines, respectively. And the plurality of stages of the second group generate the gate signals to transmit even-numbered gate lines, respectively. The first and second groups may position at the first end portion of the gate lines GL. The first group may position at the first end portion of the gate lines GL. And the second group may position at a second end portion of the gate lines GL.

The data line drive part 130 outputs analog data voltages to the data lines DL in synchronization with the gate signals. The data line drive part 130 includes at least one data line driving chip 132. The data line driving chip 132 is mounted on a flexible circuit board (FPCB) 134 connected to a printed circuit board (PCB) 140 and the first peripheral area PA1.

In an exemplary embodiment, the data line driving chip 132 is mounted on the FPCB 134 through a tape carrier package (TCP) method. However, the data line driving chips 132 can be mounted on the array substrate 110 through a chip-on glass (COG) method. According to the COG method, an additional receiving space is not necessary, and thus a slim display device can be realized.

Figure 2:
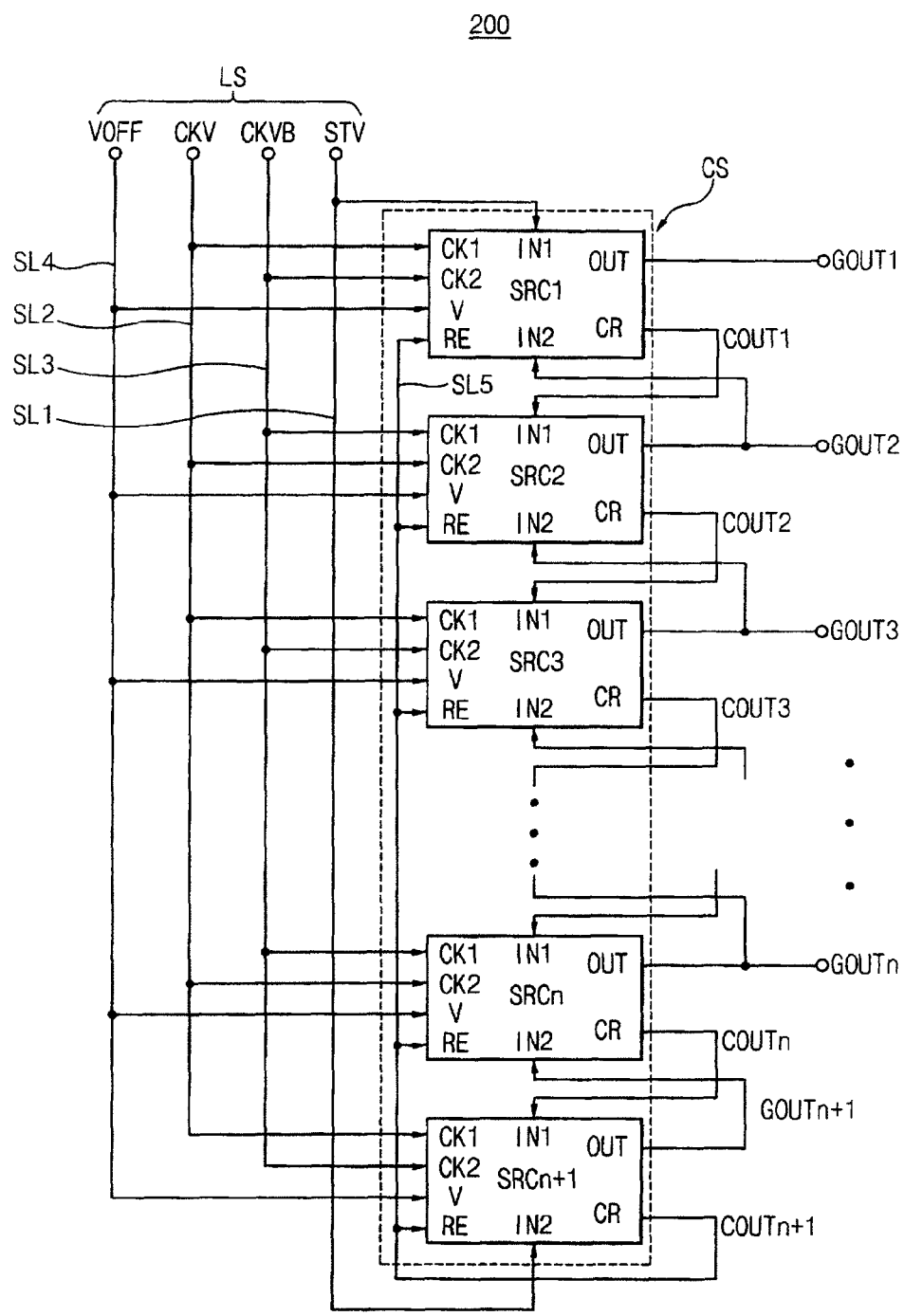
FIG. 2 is a block diagram illustrating a gate line drive circuit of FIG. 1.

FIG. 2 is a block diagram illustrating the gate line drive circuit of FIG. 1.

Referring to both FIGS. 1 and 2, the gate drive circuit 200 includes a circuit part CS including stages that are connected to each other one after another, and a line part LS that provides the circuit part CS with various control signals.

The circuit part CS includes a first stage SRC1 to an (n+1)-th stage SRCn+1 ('n' being a natural number). The circuit part CS includes stages having n driving stages and a dummy stage, the dummy stage not being connected to a gate line. In an exemplary embodiment the n driving stages are the first stage SRC1 to an n-th stage SRCn, with the (n+1)-th stage SRCn+1 being the dummy stage.

Each of the stages SRC includes a first clock terminal CK1, a second clock terminal CK2, a first input terminal IN1, a second input terminal IN2, a voltage terminal V, a reset terminal RE, an output terminal OUT and a second output terminal CR.

In an m-th stage SRCm, a first clock terminal CK1 and a second clock terminal CK2 receive clock signals, each clock signal has high level period and low level period, and the high level periods of the clock signals do not overlap with each other, 'm' being a natural number.

In an exemplary embodiment, in odd-numbered shift registers SRC1, SRC3, and the like, first clock terminals CK1 receive a first clock signal CKV, and second clock terminals CK2 receive a second clock signal CKVB. In even-numbered shift registers SRC2, SRC4, and the like, first clock terminals CK1 receive the second clock signal CKVB, and second clock terminals CK2 receive the first clock signal CKV. Each of the first clock signal CKV and the second clock signal CKVB has high and low level periods. The high level periods of the first clock signal CKV and the second clock signal CKVB do not overlap each other.

As mentioned above, in an exemplary embodiment, the circuit part CS may include first and second groups, each group has the plurality of stages that are connected one after another to each other. The plurality of stages of the first group generate the gate signals to transmit odd-numbered gate lines, respectively. And the plurality of stages of the second group generate the gate signals to transmit even-numbered gate lines, respectively. The first and second groups may position at the first end portion of the gate lines GL. Each stage of the second group positions between stages of the first group. The first group may position at the first end portion of the gate lines GL, and the second group may position at a second end portion of the gate lines GL. The circuit part CS may include a first stage to (4P+1)-th stage SRC4p+1 ('p' being a natural number). The circuit part CS includes stages having 4P driving stages and a dummy stage, the dummy stage not being connected to a date line. The first group includes a first-sub group including (4p−3)-th-numbered shift registers SRC1, SRC5, and the like, first clock terminals CK1 receive a first clock signal CKV_1, and second clock terminals CK2 receive a second clock signal CKVB_1. The first group includes a second-sub group including (4p−1)-th shift registers SRC3, SRC7, and the like, first clock terminals CK1 receive the second clock signal CKVB_1, and second clock terminals CK2 receive the first clock signal CKV_1. Each of the first clock signal CKV_1 and the second clock signal CKVB_1 has high and low level periods. The high level periods of the first clock signal CKV and the second clock signal CKVB do not overlap each other. The second group includes a third-sub group including (4p−2)-th-numbered shift registers SRC2, SRC6, and the like, first clock terminals CK1 receive a third clock signal CKV_2, and second clock terminals CK2 receive a fourth clock signal CKVB_2. The second group includes a fourth-sub group including (4p)-th-numbered shift registers SRC4, SRC8, and the like, first clock terminals CK1 receive the fourth clock signal CKVB_2, and second clock terminals CK2 receive the third clock signal CKV_2. Each of the third clock signal CKV_2 and the fourth clock signal CKVB_2 has high and low level periods. The high level periods of the third clock signal CKV 2 and the fourth clock signal CKVB_B do not overlap each other. A portion of the high level period in the third clock signal CKV_2 may overlap a portion of the high level period in the first clock signal CVK_1. A portion of the high level period in the fourth clock signal CKVB_2 may overlap a portion of the high level period in the second clock signal CVKB_1.

Figure 3:
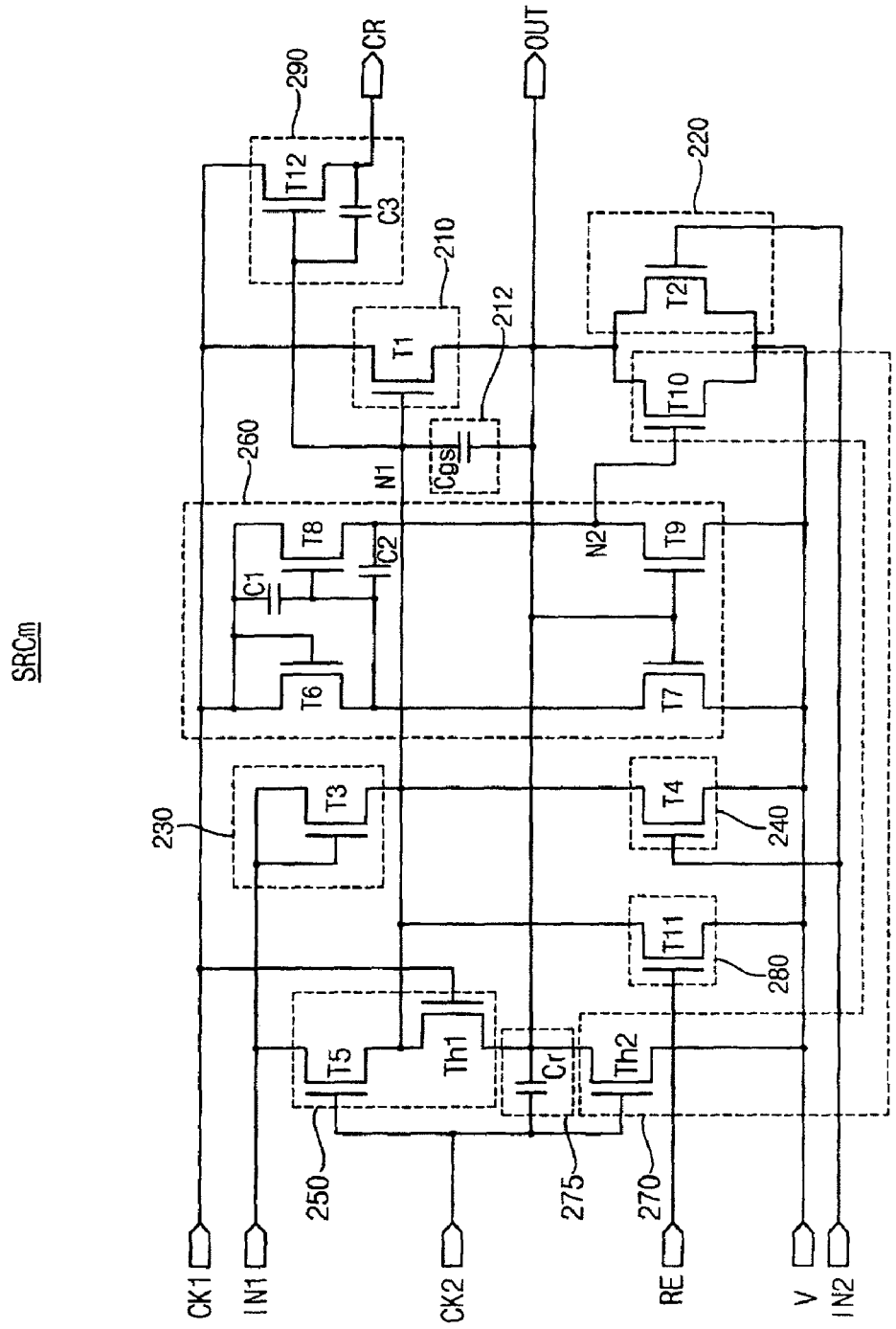
FIG. 3 is a circuit diagram illustrating a stage of FIG. 2.
Figure 4:
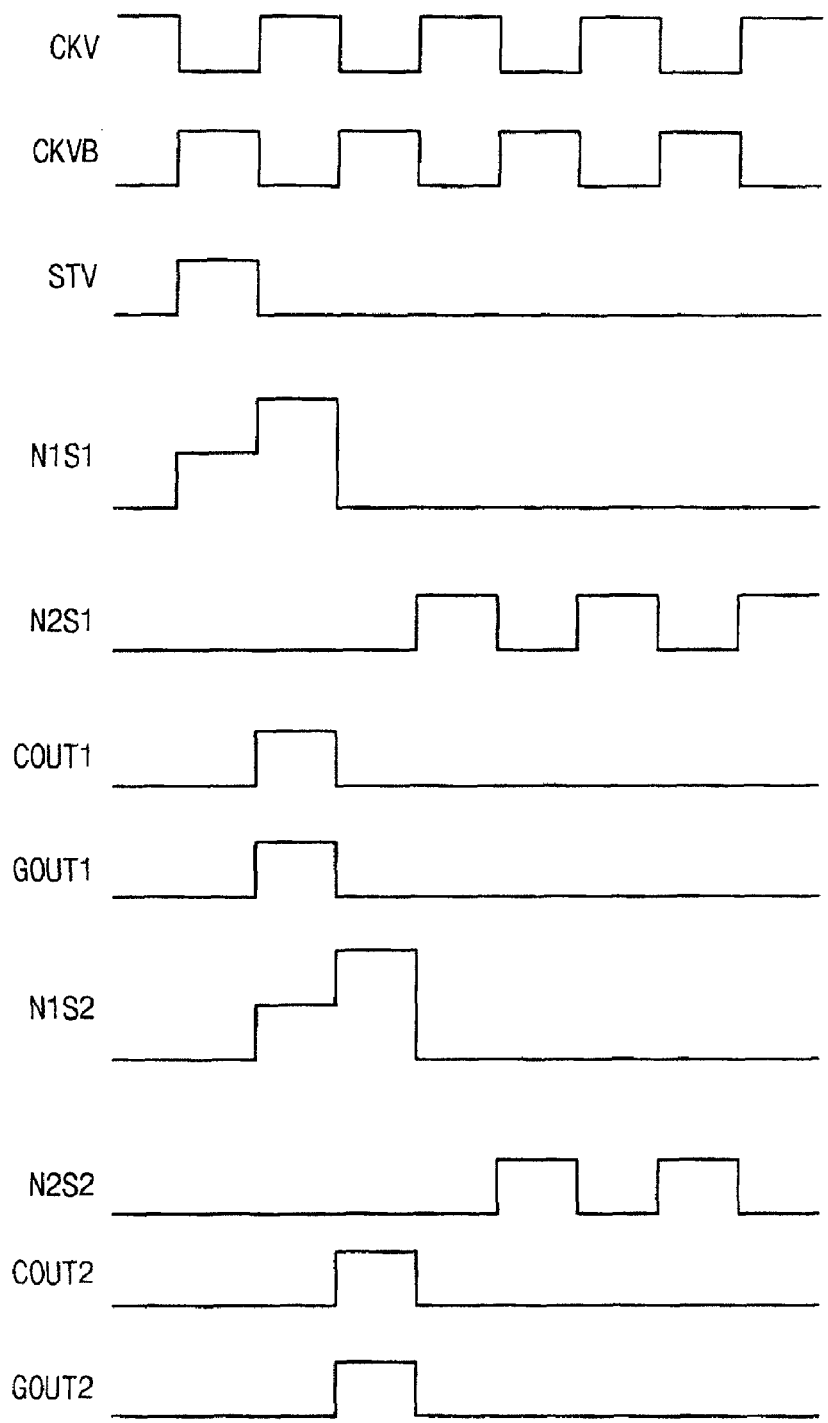
FIG. 4 is a waveform diagram illustrating signals of the stage of FIG. 2.

Referring to FIGS. 2 to 4, a first input terminal IN1 of the m-th stage SRCm receives a carry signal from an (m−1)-th stage SRCm−1, and a first input terminal IN1 of the first stage SRC1 receives a vertical start signal STV.

A second terminal IN2 of the m-th stage SRCm receives a gate signal from an (m+1)-th stage SRCm+1, and a second input terminal IN2 of the (n+1)-th stage SRCn+1, which is the last stage, receives the vertical start signal STV.

The voltage terminal V commonly receives an off-voltage VOFF, and the reset terminal RE commonly receives a carry signal from the (n+1)-th stage SRCn+1. In an exemplary embodiment the reset terminal RE can commonly receive the gate signal from the (n+1)-th stage SRCn+1.

The first output terminal OUT outputs the gate-on voltage which is a signal in a high level applied from the first clock terminal CK1, when a clock signal applied to the first clock terminal CK1 is in a high level. In an exemplary embodiment output terminals OUT of the odd-numbered shift registers SRC1, SRC3, and the like, output the gate-on voltages which are signals in high levels applied form the first clock terminal CK1, when the first clock signal CKV is in a high level. In addition, output terminals OUT of the even-numbered shift registers SRC2, SRC4, etc. output the gate-on voltage which are signals in high levels applied from the first clock terminal CK1, when the second clock signal CKVB is in a high level.

The second output terminal CR outputs a carry signal substantially the same as the signal from the first output terminal OUT based upon the clock signal applied to the first clock terminal CK1. In an exemplary embodiment, the carry signal may be outputted from the first output terminal OUT. That is, the second output terminal CR may be omittable.

The gate line drive circuit 200 includes a line part LS formed along ends of the first stage SRC1 to the last stage SRCn+1 to provide the first stage SRC1 to the last stage SRCn+1 with a synchronizing signal and a driving voltage.

The line part LS includes a start signal line SL1, a first clock line SL2, a second clock line SL3, a power line SL4 and a reset line SL5.

The start signal line SL1 receives the vertical start signal STV from an external device (not shown), and provides the first input terminal IN1 of the first stage SRC1 and the second terminal IN2 of the (n+1)-th stage SRCn+1, which is the last stage, with the vertical start signal STV.

The first clock line SL2 receives the first clock signal CKV from the external device. The first clock line SL2 provides the first clock terminals CK1 of the odd-numbered shift registers SRC1, SRC3, and the like, and the second clock terminals CK2 of the even-numbered shift registers SRC2, SRC4, etc. with the first clock signal CKV.

The second clock line SL3 receives the second clock signal CKVB from an external device (not shown), and provides second clock terminals CK2 of the odd-numbered shift registers SRC1, SRC3, and the like, the first clock terminals CK1 of the even-numbered shift registers SRC2, SRC4, and the like, with the second clock signal CKVB.

The power line SL4 receives the off-voltage VOFF from the external device to provide the voltage terminals V of the first stage SRC1 to the (n+1)-th stage SRCn+1 with the off-voltage VOFF.

The reset line SL5 receives the carry signal provided from the (n+1)-th stage SRCn+1, and provides the reset terminals RE of the first stage SRC1 to the (n+1)-th stage SRCn+1 with the carry signal. In an exemplary embodiment the reset line SL5 can receive the output signal of the (n+1)-th stage SRCn+1 to provide the reset terminals RE of the first stage SRC1 to the (n+1)-th stage SRCn+1 with the gate signal.

FIG. 3 is a circuit diagram illustrating a representative stage of FIG. 2. FIG. 4 is a waveform diagram illustrating representative signals of the stage of FIG. 2.

In this case, for convenience of description, it is described that the first clock terminal CK1 receives the first clock signal CKV and the second clock terminal CK2 receives the second clock signal CKVB. The high level period of the second clock signal CKVB do not overlap the high level period of the first clock signal CKV. Referring to FIG. 4, the signals of the first stage SRC1 and the second stage SRC2 are representative examples.

Referring to FIGS. 2 to 4, the m-th stage SRCm of the gate line drive circuit 200 includes a pull-up part 210 and a pull-down part 220.

The pull-up part 210 outputs a high level of the first clock signal CKV, which is the gate-on voltage, to the first output terminal OUT such that the pull-up part 210 pulls up an m-th gate signal GOUTm. The pull-down part 220 discharges the first output terminal OUT to be the off-voltage VOFF, which is the gate-off voltage, in response to an (m+1)-th gate signal GOUTm+1 of the (m+1)-th stage SRCm+1.

The pull-up part 210 includes a first transistor T1 having a gate electrode electrically connected to a first node N1, a drain electrode electrically connected to the first clock terminal CK1, and a source electrode electrically connected to the first output terminal OUT. The pull-down part 220 includes a second transistor T2 having a gate electrode electrically connected to a second input terminal IN2, a drain electrode electrically connected to the first output terminal OUT, and a source electrode electrically connected to a voltage terminal V providing the off-voltage VOFF to the source electrode.

The m-th stage SRCm further includes a pull-up drive part. The pull-up drive part turns on the pull-up part 210 in response to a (m−1)-th carry signal COUTm−1 of the (m−1)-th stage SRCm−1, and turns off the pull-up part 210 in response to the (m+1)-th gate signal GOUTm+1 of the (m+1)-th stage SRCm+1. The pull-up drive part includes a buffer part 230, a charging part 212 and a discharging part 240. In an exemplary embodiment, the carry signal COUTm−1 may be a output signal GOUTm−1 of the (m−1)-th stage SRCm−1.

The buffer part 230 includes a third transistor T3. The third transistor T3 has a gate electrode and a drain electrode commonly connected to the first input terminal IN1, and a source electrode electrically connected to a first node N1 that is electrically connected to the gate electrode of the first transistor T1. In this case, the first node N1 may be defined as a control node controlling on/off operation of the pull-up part 210. In addition, a signal of the first node N1 represents a first node signal N1Sm.

When 'm' of the m-th stage SRCm is '1', the buffer part 230 receives the vertical start signal STV and the first transistor T1 is turned on in synchronization with the vertical start signal STV, such that the first node receives a signal in a high state.

In addition, in the $2^{nd}$ stage SRC2 to the (m+1)-th stage SRCm+1, the buffer part 230 receives the (m−1)-th carry signal COUTm−1 as the first input signal.

The charging part 212 includes a charging capacitor Cgs having a first electrode electrically connected to the first node N1 and a second electrode electrically connected to the first output terminal OUT. For example, the charging capacitor Cgs is disposed between the gate electrode and the source electrode of the first transistor T1.

The discharging part 240 includes a fourth transistor T4 having a gate electrode electrically connected to the second input terminal IN2, a drain electrode electrically connected to the first node N1, and a source electrode electrically connected to the voltage terminal V to receive the off-voltage VOFF.

When the third transistor T3 is turned on in response to the (m−1)-th carry signal COUTm−1, the (m−1)-th carry signal COUTm−1 is charged in the charging capacitor Cgs of the pull-up drive part. When an electric charge higher than threshold voltage of the first transistor T1 is charged in the charging capacitor Cgs and the first clock signal CKV in a low stage becomes in a high state, the first transistor T1 is boosted up to output the high level of the first clock signal CKV to the first output terminal OUT.

That is, since the (m−1)-th carry signal is applied thereto, the m-th gate signal GOUTm is boosted up after passing 1H ('H' being a horizontal period). Then, when the fourth transistor T4 is turned on in response to the (m+1)-th gate signal GOUTm+1, the charging capacitor Cgs is discharged to the off-voltage VOFF such that the first transistor T1 is turned off.

The m-th stage SRCm further includes a first holding part 250, a switching part 260, a second holding part 270 and a ripple-removing part 275.

The first holding part 250 maintains the first node N1 at the off-voltage VOFF state. The switching part 260 controls on/off operation of the second holding part 270. The second holding part 270 maintains the m-th gate signal GOUTm output from the first output terminal OUT at the off-voltage VOFF state which is the gate-off voltage. The ripple-removing part 275 removes a positive ripple voltage at the first node N1 by providing a negative ripple voltage to the first node N1 according to the second clock signal CKVB.

The first holding part 250 includes a fifth transistor T5 and a first hold transistor Th1. The fifth transistor T5 has a gate electrode electrically connected to the second clock terminal CK2, a drain electrode electrically connected to the first input terminal IN1, and a source electrode electrically connected to the first node N1. The first hold transistor Th1 has a gate electrode electrically connected to the first clock terminal CK1, a drain electrode electrically connected to the first node N1, and a source electrode electrically connected to the first output terminal OUT.

The first holding part 250 maintains the signal of the first node N1 at the off-voltage VOFF state after the m-th gate signal GOUTm is pulled down. For example, when the first hold transistor Th1 is turned on in response to the first clock signal CKV, the first node N1 receives the m-th gate signal GOUTm that is pulled down to the off-voltage VOFF state, which is the gate-off voltage of the GOUTm, such that the signal of the first node N1 is maintained in the off-voltage VOFF state. In addition, when the fifth transistor T5 is turned on in response to the second clock signal CKVB, the first node receives the (m−1)-th carry signal COUTm−1 that is in the off-voltage VOFF state such that the signal of the first node N1 is maintained in the off-voltage VOFF state.

Accordingly, the fifth transistor T5 and the first hold transistor Th1 are turned on, respectively, in response to the second clock signal CKVB and the first clock signal CKV to maintain the signal of the first node N1 at the off-voltage VOFF state.

The switching part 260 includes a sixth transistor T6, a seventh transistor T7, an eighth transistor T8, a ninth transistor T9, a first capacitor C1 and a second capacitor C2.

The sixth transistor T6 has a gate electrode and drain electrode electrically connected to the first clock terminal CK1, and a source electrode electrically connected to a gate electrode of the eighth transistor T8. The seventh transistor T7 has a gate electrode electrically connected to the first output terminal OUT, a drain electrode electrically connected to the source electrode of the sixth transistor T6, and a source electrode electrically connected to the voltage terminal V to receive the off-voltage VOFF. The eighth transistor T8 has a drain electrode electrically connected to the first clock terminal CK1, the gate electrode electrically connected to the first clock terminal CK1 through the capacitor C1, and a source electrode electrically connected to a drain electrode of the ninth transistor T9. The drain electrode of the ninth transistor T9 is connected to the second node N2. In addition, the second capacitor C2 is connected between the gate electrode and the source electrode of the eighth transistor T8. The ninth transistor T9 has a gate electrode electrically connected to the first output terminal OUT, and a source electrode electrically connected to the voltage terminal V to receive the off-voltage VOFF.

In this case, a signal applied to the second node N2 of the m-th stage is defined as a second node signal N2Sm.

The seventh and ninth transistors T7, T9 are turned on such that the source electrodes of the sixth and eighth transistors T6, T8 are discharged to the off-voltage VOFF when sixth and eighth transistors T6, T8 are turned on by the first clock signal CKV and the first output terminal OUT (i.e., the m-th gate signal) is pulled up. Thus, a voltage potential of the second node N2 is at a low level.

The second holding part 270 includes a second hold transistor Th2 and a tenth transistor T10. The second hold transistor Th2 has a gate electrode electrically connected to the second clock terminal CK2, a drain electrode electrically connected to the first output terminal OUT, a source electrode electrically connected to the voltage terminal V to receive the off-voltage VOFF. The tenth transistor T10 has a drain electrode electrically connected to the first output terminal OUT, a source electrode electrically connected to the voltage terminal V to receive the off-voltage VOFF, and a gate electrode electrically connected to the second node N2 in the switching part 260.

Since a voltage potential of the second node N2 has a low state, the tenth transistor T10 is turned off.

Then, when the m-th gate signal GOUTm from the first output terminal OUT is pulled down, the seventh and ninth transistors T7, T9 are turned off. At this time, when the first clock signal CKV is in a high level, the voltage at the second node N2 becomes high by output voltages from the sixth and eighth transistors T6, T8. Therefore, the tenth transistor T10 is turned on, such that the first output terminal OUT is discharged to the off-voltage VOFF more quickly.

When the first clock signal CKV becomes low, the tenth transistor T10 is turned off by the voltage in a low stage at the second node N2. On the other hand, the second hold transistor Th2 is turned on by the second clock signal CKVB to discharge the first output terminal OUT to the off-voltage VOFF.

Therefore, the second hold transistor Th2 and the tenth transistor T10 alternately discharge the first output terminal OUT to the off-voltage VOFF, which is the gate-off voltage, in response to the second clock signal and the voltage at the second node N2, respectively.

The ripple-removing part 275 includes a ripple-removing capacitor Cr. A first end of the ripple-removing capacitor Cr is electrically connected to the drain electrode of the second holding transistor Th2, and a second end of the ripple-removing capacitor Cr is electrically connected to the second clock terminal CK2. In an exemplary embodiment the ripple-removing capacitor Cr has a capacitance of from 0.1 pF to about 2.0 pF. Thus, the ripple-removing capacitor Cr charges with the second clock signal CKVB when the second clock signal CKVB is in a high level, and the ripple-removing capacitor Cr discharges the second clock signal CKVB charged in the ripple-removing capacitor Cr when the second clock signal CKVB is in a low level.

In this case, when the first clock signal CKV is in a high level and the second clock signal CKVB is in a low level, a positive ripple voltage generated at the first node N1 can be removed by discharging the second clock signal CKVB that is charged in the ripple-removing capacitor Cr. In addition, the second clock signal CKVB is discharged, such that the capacitance of the charging capacitor Cgs can be increased.

The m-th stage SRCm of the gate line drive circuit 200 further includes a reset part 280 and a carry part 290.

The reset part 280 includes a eleventh transistor T11 having a gate electrode electrically connected to the reset terminal RE, a drain electrode electrically connected to the first node N1, and a source electrode electrically connected to the voltage terminal V to receive the off-voltage VOFF. The eleventh transistor T11 is turned on by the (n+1)-th carry signal COUTn+1 of the last stage SRCn+1 applied to the reset terminal RE such that the voltage of the first node N1 is discharged to the off-voltage VOFF. The eleventh transistor T11 may be turned on by the (n+1)-th gate signal GOUTn+1 of the final stage SRCn+1 applied to the reset terminal RE such that the voltage of the first node N1 is discharged to the off-voltage VOFF.

The carry part 290 includes a twelfth transistor T12 having a gate electrode electrically connected to the first node N1, a drain electrode electrically connected to the first clock terminal CK1 to receive the first clock signal CKB, and a source electrode electrically connected to the second output terminal CR. A third capacitor C3 is connected between the gate electrode and the source electrode of the twelfth transistor T12. The carry part 290 outputs the high level of the first clock signal CKV to the second output terminal CR in response to the signal of the first node N1, which becomes high. In this case, a carry signal from the second output terminal CR of the m-th stage may be defined as an m-th carry signal COUTm.

In an exemplary embodiment, the forming of the gate line drive circuit 200 and the forming of signal lines on the display area DA and the transistors on the pixels can be performed at the same time.

The charging capacitor Cgs is defined as an independent device. However, the charging capacitor Cgs can be defined as a parasitic capacitor formed between the gate electrode and the source electrode of the first transistor T1.

Figure 5:
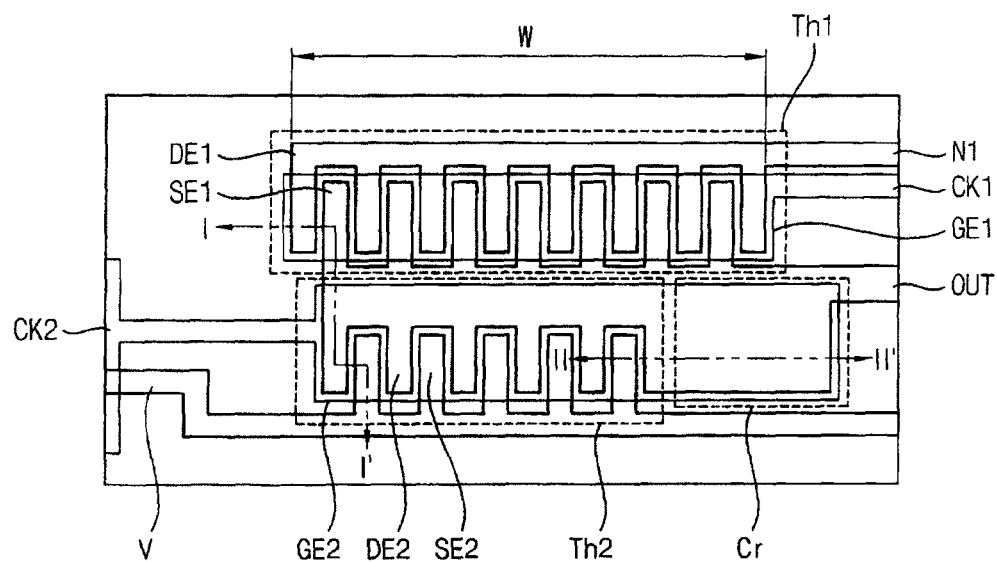
FIG. 5 is a plan view which includes a ripple-removing area of FIG. 3.
Figure 6:
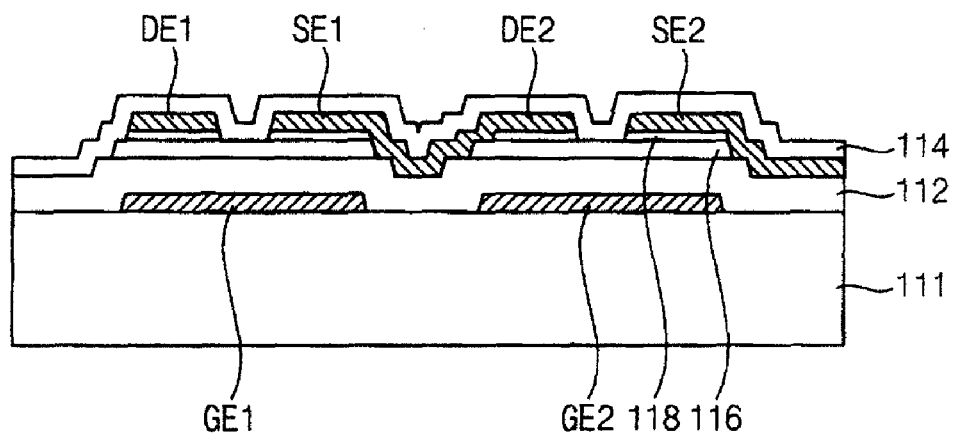
FIG. 6 is a cross-sectional view taken along a line I-I' of FIG. 5.
Figure 7:
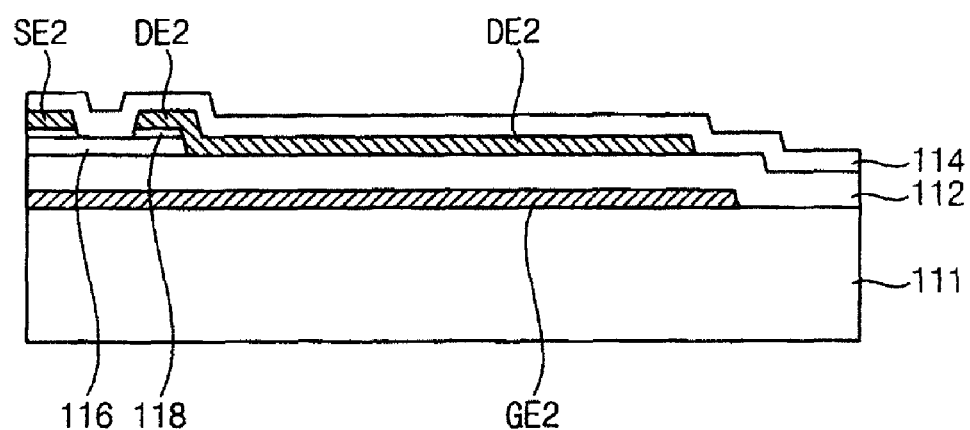
FIG. 7 is a cross-sectional view taken along a line II-II' of FIG. 5.

FIG. 5 is a plan view which includes a ripple-removing area of FIG. 3. FIG. 6 is a cross-sectional view taken along a line I-I' of FIG. 5. FIG. 7 is a cross-sectional view taken along lines II-II' of FIG. 5.

FIGS. 5 to 7 illustrate in more detail the first holding transistor Th1, the second holding transistor Th2 and the ripple-removing capacitor Cr according to an exemplary embodiment of the present invention.

For convenience of description, the gate electrode, the source electrode and the drain electrode of the first holding transistor Th1 may be defined as a first gate electrode GE1, a first source electrode SE1 and a first drain electrode DE1, respectively. The gate electrode, the source electrode and the drain electrode of the second holding transistor Th2 may be defined as a second gate electrode GE2, a second source electrode SE2 and a second drain electrode DE2, respectively.

Referring to FIGS. 3, 5, 6 and 7, the first gate electrode GE1 electrically connected to the first clock terminal CK1 is formed on a substrate 111. In addition, the second gate electrode GE2 electrically connected to the second clock terminal CK2 is formed adjacent to the first gate electrode GE1 on the substrate 111.

A first insulation layer 112 is foamed on the first gate electrode GE1 and the second gate electrode GE2.

The first source electrode SE1 electrically connected to the first output terminal OUT is foamed on the first insulation layer 112 to overlap the first gate electrode GE1. The first drain electrode DE1 spaced apart from the first source electrode SE1 is formed on the first insulation layer 112 to overlap the first gate electrode GE1.

The second source electrode SE2 electrically connected to the voltage terminal V is formed on the first insulation layer 112 to overlap the second gate electrode GE2. The second drain electrode DE2 spaced apart from the second source electrode SE2 is formed on the first insulation layer 112 to overlap the second gate electrode GE2. In this case, the first source electrode SE1 and the first drain electrode DE1 are electrically connected to each other.

In addition, a semiconductor layer 116 and an ohmic contact layer 118 are further formed between a data metal layer including the first source electrode SE1, the first drain electrode DE1, the second source electrode SE2 and the second drain electrode DE2 and a gate metal layer including the first gate electrode GE1 and the second gate electrode GE2.

In an exemplary embodiment the width W of the first gate electrode GE1 is from about 175 μm to about 225 μm.

A second insulation layer 114 is formed on the first drain electrode DE1, the second source electrode SE2 and the second drain electrode DE2.

Referring again to FIG. 7, the second drain electrode DE2 and the second gate electrode GE2 of the second holding transistor Th2 are respectively extended to overlap each other. Thus, the ripple-removing capacitor Cr is formed at one portion of the second hold transistor Th2.

There are no other lines in the one portion of the second hold transistor Th2, such that the ripple-removing capacitor Cr can be used more efficiently.

In addition, in an exemplary embodiment the second drain electrode DE2 has a U-shape to overlap the second source electrode SE2. The area of the second drain electrode DE2 is increased by the U-shape. Therefore, a capacitor can be formed between the second drain electrode DE2 and the second gate electrode GE2 such that the capacitance of the ripple-removing capacitor Cr can be increased.

Figure 8:
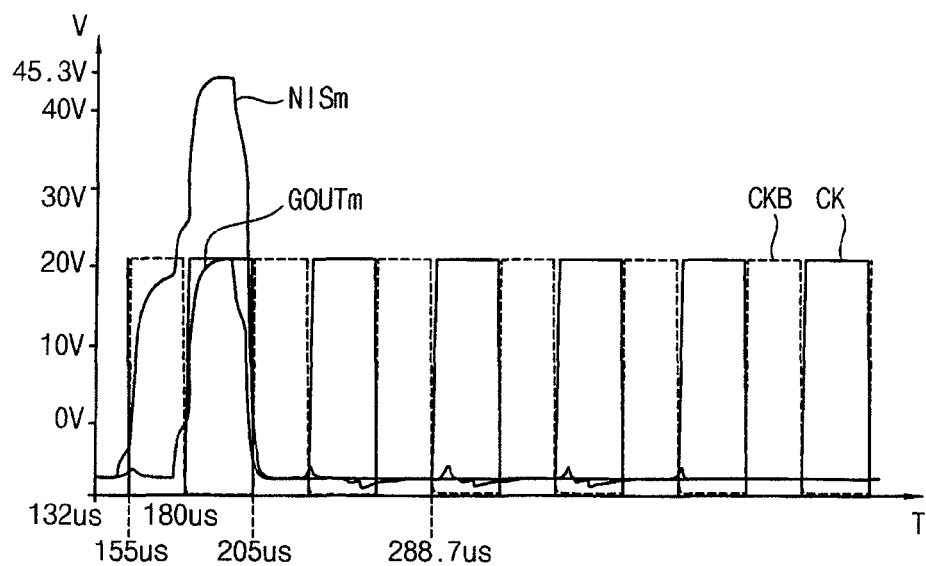
FIG. 8 is a graph showing representative measured values of the signals of the stage of FIG. 3.
Figure 9:
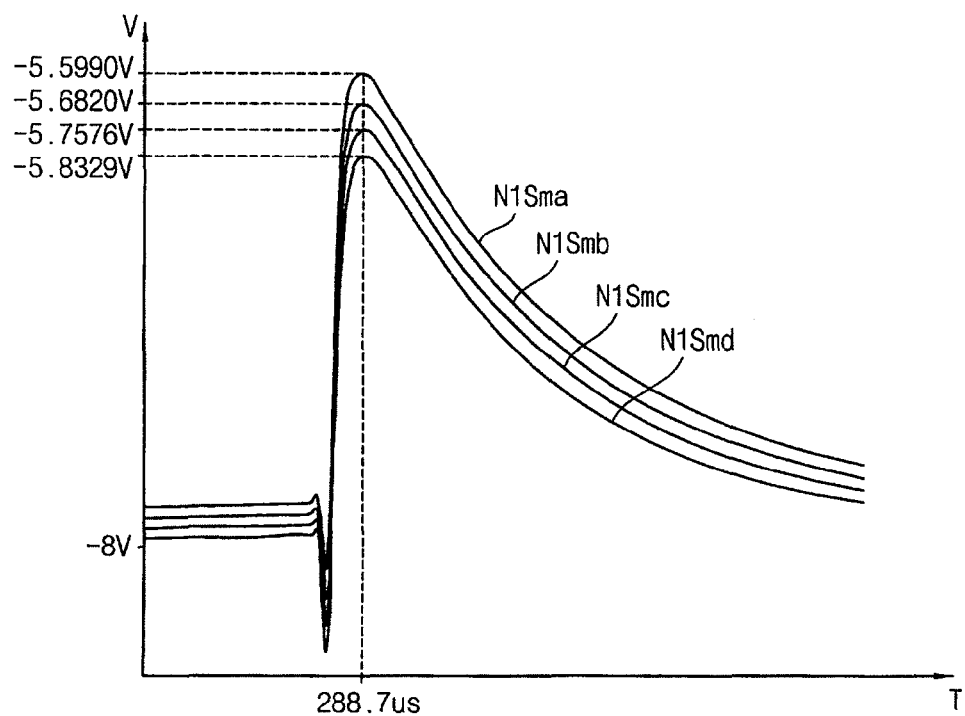
FIG. 9 is a graph showing positive ripple voltages compensated by the ripple-removing area of FIG. 3.

FIG. 8 is a graph showing representative measured values of the signals of the stage in FIG. 3. FIG. 9 is a graph showing positive ripple voltages compensated in the ripple-removing area in FIG. 8.

Referring to FIGS. 3, 4 and 8, a horizontal axis (i.e., x-axis) represents time T, and a vertical axis (i.e., y-axis) represents voltage V. As shown in FIG. 8, it can be seen that a variation of signal waveforms begins after about 132 μs from the start of measurement.

The voltage of the first node signal N1Sm which is a signal at the first node N1 rises to about 18 V based upon the vertical start signal STV or the (m−1)-th carry signal COUTm−1 when 'T' is about 155 μs. At this time, the first transistor T1 is turned on.

Then, the voltage of the first node signal N1Sm rises to about 43.0 V based upon the first clock signal CKV when 'T' is about 180 μs.

Then, the voltage of the first node signal N1Sm falls to about −8 V based upon the (m+1)-th gate signal GOUTm+1 when 'T' is about 205 μs. At this time, the first transistor T1 is turned off by the first node signal N1Sm in a low state.

Then, the first node signal N1Sm is maintained at about −8 V. However, the first clock signal CKV applied to the drain electrode of the first transistor T1 flows through the first transistor T1 which is turned off. The leaked voltage represents the positive ripple voltage.

According to an exemplary embodiment of the present invention, the positive ripple voltage can be decreased when the negative ripple voltage from the ripple-removing capacitor Cr is applied to the first node N1.

Referring again to FIG. 9, when the capacitance of the ripple-removing capacitor Cr is about 0 pF, the first node signal N1Sm is represented by a first removing node signal N1Sma. When the capacitance of the ripple-removing capacitor Cr is about 0.5 pF, the first node signal N1Sm is represented by a second removing node signal N1Smb. When the capacitance of the ripple-removing capacitor Cr is about 1.0 pF, the first node signal N1Sm is represented by a third removing node signal N1Smc. When the capacitance of the ripple-removing capacitor Cr is about 1.5 pF, the first node signal N1Sm is represented by a fourth removing node signal N1Smd.

For example, when 'T' is about 288.7 µs, the first removing node signal N1Sma, the second removing node signal N1Smb, the third removing node signal N1Smc and the fourth removing node signal N1 are about −5.5990 V, about −5.6820 V, about −5.7576 V and about −5.8329 V, respectively.

Therefore, the positive ripple voltage at the first node N1 can be reduced, such that the gate signal is more reliable when the capacitance of the ripple-removing capacitor Cr is greater.

Figure 10:
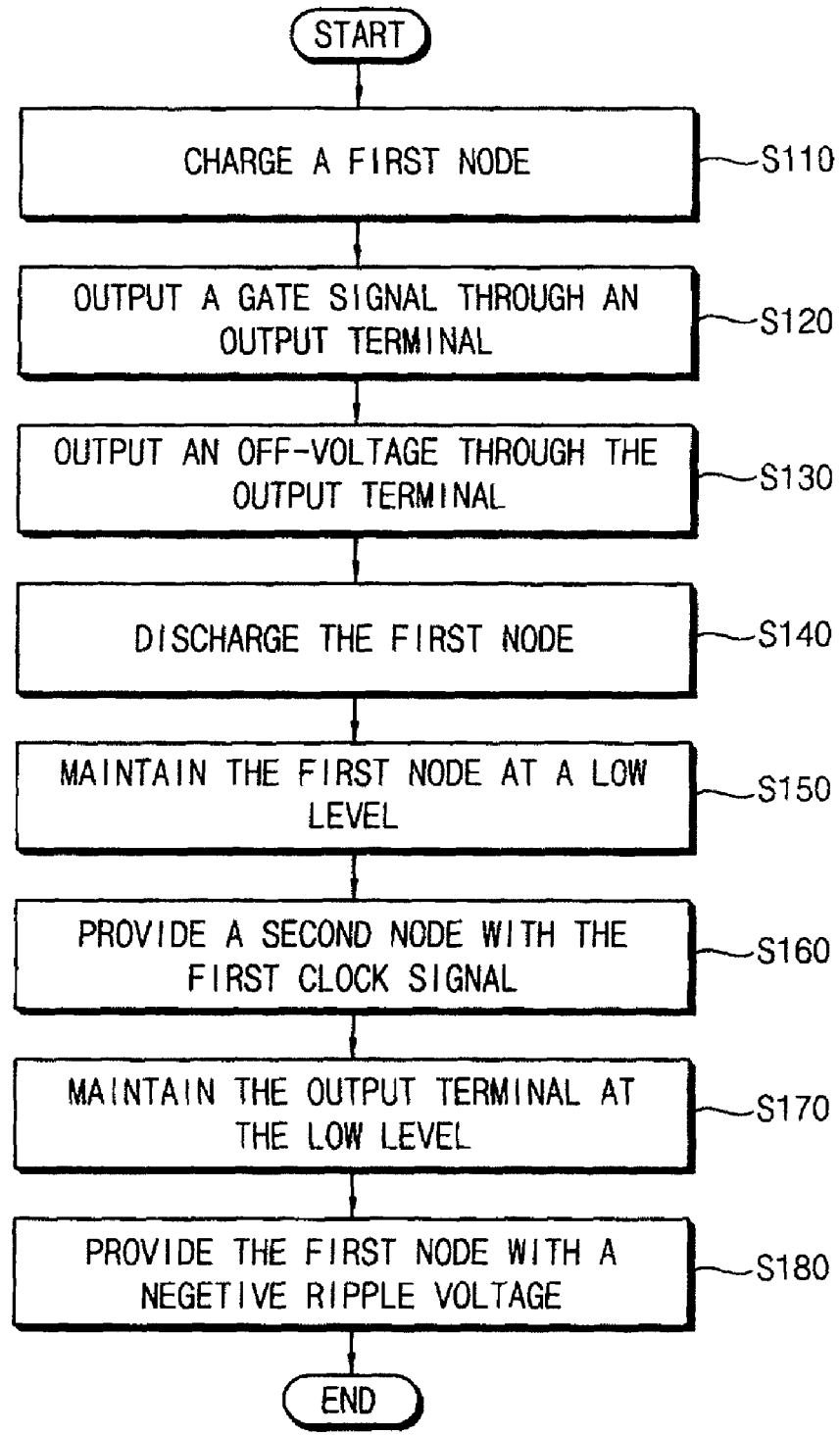
FIG. 10 is a flowchart showing an exemplary embodiment of a method of driving the gate line drive circuit of FIG. 2.

FIG. 10 is a flowchart showing an exemplary embodiment of a method of driving the gate line drive circuit of FIG. 2.

Referring to FIGS. 1, 2, 3 and 10, a method of activating the gate lines included in the display panel 200 will be described.

The charging part 212 charges the first node N1 based upon a carry signal COUT from a previous stage or a vertical start signal STV provided from a external device (step S110).

Then, the first node N1 is boosted up by the charging part 212 when the first node N1 receives the first clock signal CKV in a high level. In addition, the high level of the first clock signal CKV pulls up a gate signal output through the first output terminal OUT of a present stage (step S120).

Then, the pull-down part 220 outputs the off-voltage VOFF through the first output terminal OUT of the present stage in response to a gate signal GOUT provided from the next stage or the vertical start signal STV (step S130).

Then, the discharging part 240 discharges the first node N1 in response to the gate signal GOUT provided from the next stage or a carry signal COUT provided from a last stage (step S140).

Then, the first holding part 250 maintains the voltage of the first node N1 which is discharged at a low level in response to the first clock signal CKV and the second clock signal CKVB (step S150). Then, the switching part 260 provides the second node N2 with a signal substantially the same as the first clock signal CKV during a period in which the voltage of the first node N1 is maintained at the low level after the first node N1 is discharged (step S160).

Then, the second holding part 270 maintains the voltage of the first output terminal OUT at a low level when the voltage of the second node N2 or the second clock signal CKVB are in high levels (step S170). In this case, the second clock signal CKVB may have a phase opposite to that of the first clock signal CKV.

Then, the ripple-removing part 275 removes the positive ripple voltage of the first node N1 by providing the negative ripple voltage to the first node N1 which is discharged according to the first clock signal CKV (step S180).

In this case, the ripple-removing part 275 charges the second clock signal CKVB when the second clock signal CKVB is in a high level, and discharges the second clock signal CKVB when the second clock signal CKVB is in a low level. At this time, the negative ripple voltage is provided to the first node which is discharged.

Accordingly, the negative ripple voltage is applied to the first node N1 which is discharged. Thus, the positive ripple voltage, which is generated by the leaked current of the first clock signal CKV flowing between the drain electrode and the gate electrode of the first transistor T1 after the first node N1 is discharged, is reduced.

The leaked current can be prevented from flowing between the drain electrode and the gate electrode of the first transistor T1 and a charging rate of the charging part 212 can be reduced by increasing the width of the first holding transistor Th1. Therefore, the width of the first holding transistor Th1 and the capacitance of the ripple-removing capacitor Cr can be adjusted to reduce the positive ripple voltage efficiently. Therefore, the reliability of the gate signal which is an output signal from the gate line drive circuit 200 can be enhanced.

As described above, according to embodiments of the present invention, a negative ripple voltage is applied to a first node N1 such that a positive ripple voltage which is generated by a leaked current of a first clock signal flowing between a drain electrode and a gate electrode of a first transistor T1 in a pull-up part after the first node N1 is discharged, is reduced. Thus, the reliability of a gate signal provided from a gate drive circuit is enhanced.

The foregoing is illustrative of exemplary embodiments of the present invention and is not to be construed as limiting thereof. Those skilled in the art will readily appreciate that many modifications are possible. Accordingly, the present invention is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of driving gate lines in which output signals of a plurality of stages are output to the respective gate lines, each of the output signals comprising a gate-on voltage and a gate-off voltage, the stages being connected to each other, the stages including a first stage in which a vertical start signal is transmitted to an input terminal, the method comprising:
    boosting up a voltage of a first node based upon a carry signal from a previous stage or the vertical start signal from an external device;
    outputting the gate-on voltage pulled up through an output terminal of a present stage based upon a high level of a first clock signal, in response to a high level of the first node;
    outputting the gate-off voltage through the output terminal of the present stage in response to the output signal from a next stage or the vertical start signal;
    discharging the first node in response to the output signal from the next stage or a carry signal from a last stage; and
    applying a negative ripple voltage to the first node which is discharged in accordance with the first clock signal.

2. The method of claim 1, wherein the negative ripple voltage is generated by a first capacitor, and one end of the first capacitor is connected to the output terminal.

3. The method of claim 2, wherein applying the negative ripple voltage comprises:
    charging a second clock signal when the second clock signal is in a high level; and
    discharging the second clock signal when the second clock signal is in a low level.

4. The method of claim 1, further comprising:
maintaining a voltage of the first node at a low level in response to the first clock signal after the first node is discharged;
applying a signal substantially the same as the first clock signal to a second node during a period in which the voltage of the first node is maintained at the low level; and
maintaining the gate-off voltage of the output terminal when a signal of the second node or a second clock signal is in a high level.

5. A gate line drive circuit comprising a plurality of stages connected to each other, the gate line drive circuit configured to output output signals of respective stages to gate lines, each of the output signals comprising a gate-on voltage and a gate-off voltage, each of the stages comprising:
a charging part that boosts up a voltage of a first node based upon a carry signal from a previous stage or a vertical start signal from an external device;
a pull-up part that outputs the gate-on voltage pulled up through an output terminal of a present stage in response to a high level of a first clock signal, in response to a high level of the first node;
a pull-down part that outputs the gate-off voltage through the output terminal in response to the output signal from a next stage or the vertical start signal;
a discharging part that discharges the first node in response to the output signal from the next stage or a carry signal from a last stage; and
a negative ripple voltage applying part that applies a negative ripple voltage to the first node which is discharged in accordance with the first clock signal.

6. The gate line drive circuit of claim of claim 5, wherein the carry signal of the previous stage is the output signal of the previous stage.

7. The gate line drive circuit of claim 5, wherein the negative ripple voltage is generated by a first capacitor, and one end of the first capacitor is connected to the output terminal.

8. The gate line drive circuit of claim 5, wherein the negative ripple voltage applying part comprises a first capacitor that charges a second clock signal when the second clock signal is in a high level.

9. The gate line drive circuit of claim 8, wherein the first capacitor has a capacitance of about 0.1 pF to about 2.0 pF.

10. The gate line drive circuit of claim 5, further comprising:
a first holding part that maintains a voltage of the first node at a low level in response to the first clock signal after the first node is discharged;
a switching part that provides a signal substantially the same as the first clock signal to a second node during a period in which the voltage of the first node is maintained at the low level; and
a second holding part that maintains the gate-off voltage of the output terminal at a low level when a signal of the second node or a second clock signal is in a high level.

11. A display device comprising:
a display panel comprising a display area, in which a plurality of pixels are connected to gate lines and data lines that cross each other, and a peripheral area surrounding the display area;
a data line drive part that outputs data signals to the data lines; and
a gate line drive circuit comprising a plurality of stages connected to each other, the gate line drive circuit configured to output output signals of respective stages to respective gate lines, each of the output signals comprising a gate-on voltage and a gate-off voltage,
wherein each of the stages comprises:
a charging part that boosts up a voltage of a first node based upon a carry signal from a previous stage or the vertical start signal from an external device;
a pull-up part that outputs the gate-on voltage pulled up through an output terminal of a present stage in response to a high level of a first clock signal, in response to a high level of the first node;
a pull-down part that outputs a gate-off voltage through the output terminal in response to an output signal from a next stage or the vertical start signal;
a discharging part that discharges the first node in response to the output signal from the next stage or a carry signal from a last stage; and
a negative ripple voltage applying part that applies a negative ripple voltage to the first node which is discharged in accordance with the first clock signal.

12. The display device of claim 11, wherein the negative ripple voltage applying part comprises a first capacitor that charges a second clock signal when the second clock signal is in a high level and that discharges the second clock signal when the second clock signal is in a low level.

13. The display device of claim 12, wherein one end of the first capacitor is connected to the output terminal.

14. The display device of claim 11, wherein the gate line drive circuit is formed on the peripheral area.

15. The display device of claim 11, wherein each of the stages further comprises:
a first holding part that maintains a voltage of the first node at a low level in response to the first clock signal after the first node is discharged;
a switching part that provides a signal substantially the same as the first clock signal to a second node during a period in which the voltage of the first node is maintained at the low level; and
a second holding part that maintains the gate-off voltage of the output terminal at a off-voltage level when a signal of the second node or a second clock signal is in a high level.

16. The display device of claim 15, wherein the first holding part comprises a first holding transistor that electrically connects the first node and the output terminal to each other in response to the first clock signal.

17. The display device of claim 16, wherein the second holding part comprises a second holding transistor that maintains the gate-off voltage of the output terminal at the off-voltage level in response to the second clock signal.

18. The display device of claim 17, wherein the first holding transistor comprises:
a first source electrode electrically connected to the output terminal;
a first drain electrode electrically connected to the first node; and
a first gate electrode that receives the first clock signal.

19. The display device of claim 18, wherein the second holding transistor comprises:
a second source electrode that receives the off-voltage;
a second drain electrode electrically connected to the first source electrode; and
a second gate electrode that receives the second clock signal.

20. The display device of claim 19, wherein the second drain electrode and the second gate electrode overlap each other to form the first capacitor.

21. A method of driving gate lines in which output signals of a plurality of stages are output to the respective gate lines, each of the output signals comprising a gate-on voltage and a gate-off voltage, the stages being connected to each other, the stages including a first stage in which a vertical start signal is transmitted to an input terminal, the method comprising:
> boosting up a voltage of a first node based upon a carry signal from a previous stage or the vertical start signal from an external device;
> outputting the gate-on voltage pulled up through an output terminal of a present stage based upon a high level of a first clock signal, in response to a high level of the first node;
> outputting the gate-off voltage through the output terminal of the present stage in response to the output signal from a next stage or the vertical start signal;
> discharging the first node in response to the output signal from the next stage or a carry from a last stage;
> charging a second clock signal when the second clock signal is in a high level; and
> discharging the second clock signal when the second clock signal is in a low level.

22. The method of claim 21, wherein charging the second clock signal when the second clock signal is in a high level and discharging the second clock signal when the second clock signal is in a low level, are operated by a first capacitor, and one end of the first capacitor is connected to the output terminal.

23. A gate line drive circuit comprising a plurality of stages connected to each other, the gate line drive circuit configured to output output signals of respective stages to gate lines, each of the output signals comprising a gate-on voltage and a gate-off voltage, each of the stages comprising:
> a charging part that boosts up a voltage of a first node based upon a carry signal from a previous stage or a vertical start signal from an external device;
> a pull-up part that outputs the gate-on voltage pulled up through an output terminal of a present stage in response to a high level of a first clock signal, in response to a high level of the first node;
> a pull-down part that outputs the gate-off voltage through the output terminal in response to the output signal from a next stage or the vertical start signal;
> a discharging part that discharges the first node in response to the output signal from the next stage or a carry signal from a last stage; and
> a ripple reducing part that includes a first capacitor that reduces a ripple voltage of the first node which is discharged in accordance with the first clock signal wherein one end of the first capacitor is connected to the output terminal.

24. The gate line drive circuit of claim 23, wherein the first capacitor charges a second clock signal when the second clock signal is in a high level.

25. A display device comprising:
> a display panel comprising a display area, in which a plurality of pixels are connected to gate lines and data lines that cross each other, and a peripheral area surrounding the display area;
> a data line drive part that outputs data signals to the data lines; and
> a gate line drive circuit comprising a plurality of stages connected to each other, the gate line drive circuit configured to output signals of respective stages to respective gate lines, each of the output signals comprising a gate-on voltage and a gate-off voltage,
> wherein each of the stages comprises:
>> a charging part that boosts up a voltage of a first node based upon a carry signal from a previous stage or the vertical start signal from an external device;
>> a pull-up part that outputs the gate-on voltage pulled up through an output terminal of a present stage in response to a high level of a first clock signal, in response to a high level of a first clock signal, in response to a high level of the first node;
>> a pull-down part that outputs a gate-off voltage through the output terminal in response to an output signal from a next stage or the vertical start signal;
>> a discharging part that discharges the first node in response to the output signal from the next stage or a carry signal from a last stage; and
>> a ripple reducing part that includes a first capacitor that reduces a ripple voltage of the first node which is discharged in accordance with the first clock signal wherein one end of the first capacitor is connected to the output terminal.

26. The display device of claim 25, wherein the first capacitor charges a second clock signal when the second clock signal is in a high level and discharges the second clock signal when the second clock signal is in a low level.

* * * * *